(12) United States Patent
Zhang (10) Patent No.: US 11,881,281 B2
(45) Date of Patent: Jan. 23, 2024

(54) DUAL REFERENCE VOLTAGE GENERATOR, EQUALIZER CIRCUIT, AND MEMORY

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 157 days.

(21) Appl. No.: 17/398,180

(22) Filed: Aug. 10, 2021

(65) Prior Publication Data

US 2022/0093140 A1  Mar. 24, 2022

Related U.S. Application Data

(63) Continuation of application No. PCT/CN2021/097395, filed on May 31, 2021.

(30) Foreign Application Priority Data

Sep. 24, 2020 (CN) .......................... 202011017186.3

(51) Int. Cl.
G11C 5/14 (2006.01)

(52) U.S. Cl.
CPC .................................. G11C 5/147 (2013.01)

(58) Field of Classification Search
CPC .................................. G11C 5/147; G11C 5/14
USPC .................................................... 365/189.09
See application file for complete search history.

(56) References Cited

U.S. PATENT DOCUMENTS

| | | |
|---|---|---|
| 5,120,985 A | 6/1992 | Kimura |
| 8,457,190 B2 | 6/2013 | Raghavan |
| 8,947,119 B2 | 2/2015 | Jang |
| 9,317,052 B1 | 4/2016 | Hwang |
| 9,659,618 B1 | 5/2017 | Huang |
| 9,806,915 B1 | 10/2017 | Elzeftawi et al. |
| 10,014,907 B2 | 7/2018 | Choi |
| 10,147,466 B1 | 12/2018 | Taylor et al. |
| 10,347,319 B2 | 7/2019 | Mozak et al. |
| 10,482,932 B2 | 11/2019 | Taylor et al. |
| 10,938,607 B2 | 3/2021 | Shen |

(Continued)

FOREIGN PATENT DOCUMENTS

| | | |
|---|---|---|
| CN | 1889552 A | 1/2007 |
| CN | 101340408 A | 1/2009 |

(Continued)

OTHER PUBLICATIONS

Supplementary European Search Report in the European application No. 21773432.6, dated Jun. 8, 2022, 9 pgs.

(Continued)

Primary Examiner — Muna A Techane
(74) Attorney, Agent, or Firm — Cooper Legal Group, LLC (57) ABSTRACT

A dual reference voltage generator, an equalizer circuit, and a memory are provided. The dual reference voltage generator is configured to receive an original code, a first code and a second code, generate a first reference voltage according to the received original code and first code, and generate a second reference voltage according to the received original code and second code. The first reference voltage is different from the second reference voltage.

16 Claims, 7 Drawing Sheets

(56) References Cited

U.S. PATENT DOCUMENTS

| | | |
|---|---|---|
| 2004/0022115 A1* | 2/2004 | Park .................. G11C 29/12 365/201 |
| 2004/0203559 A1 | 10/2004 | Stojanovic |
| 2005/0111585 A1 | 5/2005 | Stojanovic |
| 2005/0146350 A1* | 7/2005 | Kim .................. H04L 25/0278 326/30 |
| 2006/0233291 A1 | 10/2006 | Garlepp |
| 2009/0003089 A1 | 1/2009 | Do |
| 2009/0010320 A1 | 1/2009 | Hollis |
| 2009/0175326 A1 | 7/2009 | Stojanovic |
| 2009/0285272 A1 | 11/2009 | Stojanovic |
| 2010/0085087 A1 | 4/2010 | Dash |
| 2010/0142610 A1 | 6/2010 | Stojanovic |
| 2011/0096825 A1 | 4/2011 | Hollis |
| 2012/0194364 A1* | 8/2012 | Chio .................. H03M 1/145 341/110 |
| 2012/0213267 A1 | 8/2012 | Stojanovic |
| 2012/0224621 A1 | 9/2012 | Stojanovic |
| 2013/0028313 A1 | 1/2013 | Shen |
| 2013/0202061 A1 | 8/2013 | Chandrasekaran |
| 2013/0259162 A1 | 10/2013 | Qin |
| 2013/0342240 A1 | 12/2013 | Amirkhany |
| 2014/0002130 A1* | 1/2014 | Jang .................. H03K 17/166 326/30 |
| 2014/0226707 A1 | 8/2014 | Kaviani |
| 2015/0319016 A1 | 11/2015 | Stojanovic et al. |
| 2015/0333744 A1 | 11/2015 | Chang |
| 2015/0333938 A1 | 11/2015 | Kaviani |
| 2016/0209462 A1 | 7/2016 | Choi |
| 2016/0241249 A1 | 8/2016 | Balamurugan et al. |
| 2016/0308693 A1 | 10/2016 | Stojanovic et al. |
| 2016/0365137 A1 | 12/2016 | Schumann |
| 2017/0373521 A1 | 12/2017 | Kong et al. |
| 2018/0024881 A1 | 1/2018 | Lu |
| 2018/0287829 A1 | 10/2018 | Stojanovic et al. |
| 2019/0096445 A1 | 3/2019 | Taylor et al. |
| 2019/0164594 A1 | 5/2019 | Eom |
| 2019/0268187 A1 | 8/2019 | Stojanovic et al. |
| 2020/0133542 A1 | 4/2020 | Kim |
| 2020/0259686 A1 | 8/2020 | Shen |
| 2021/0075651 A1 | 3/2021 | Stojanovic et al. |
| 2021/0218544 A1 | 7/2021 | Choy |
| 2022/0083244 A1* | 3/2022 | Um .................. G11C 7/1051 |
| 2023/0140420 A1 | 5/2023 | Stojanovic |

FOREIGN PATENT DOCUMENTS

| | | |
|---|---|---|
| CN | 101385300 A | 3/2009 |
| CN | 105471787 A | 4/2016 |
| CN | 107657978 A | 2/2018 |
| CN | 110021315 A | 7/2019 |
| CN | 105282063 B | 1/2020 |
| CN | 110719242 A | 1/2020 |
| CN | 110800055 A | 2/2020 |
| CN | 111126615 A | 5/2020 |
| CN | 210606637 U | 5/2020 |
| CN | 111489779 A | 8/2020 |
| EP | 0381095 A2 | 8/1990 |
| JP | 2009110643 A | 5/2009 |
| JP | 2019102119 A | 6/2019 |
| JP | 2019522289 A | 8/2019 |
| KR | 20120098306 A | 9/2012 |
| TW | 201901457 A | 1/2019 |
| WO | 2013039624 A1 | 3/2013 |
| WO | 2018005137 A1 | 1/2018 |
| WO | 2020005592 A1 | 1/2020 |

OTHER PUBLICATIONS

International Search Report in the international application No. PCT/CN2021/097395, dated Aug. 18, 2021, 2 pgs.

International Search Report in the international application No. PCT/CN2021/097401, dated Aug. 26, 2021, 3 pgs.

First Office Action of the U.S. Appl. No. 17/400,491, dated Aug. 17, 2022, 29 pgs.

Supplementary European Search Report in the European application No. 21867897.7, dated May 26, 2023. 9 pages.

First Office Action of the Japanese application No. 2022-539727, dated Jul. 11, 2023. 7 pages with English translation.

First Office Action of the Chinese application No. 202011018885.X, dated May 26, 2023. 7 pages with English abstract.

* cited by examiner

DUAL REFERENCE VOLTAGE GENERATOR, EQUALIZER CIRCUIT, AND MEMORY

CROSS-REFERENCE TO RELATED APPLICATIONS

This application is a continuation of International Application No. PCT/CN2021/097395, filed on May 31, 2021, which claims priority to Chinese Patent Application No. 202011017186.3, filed on Sep. 24, 2020. The disclosures of International Application No. PCT/CN2021/097395 and Chinese Patent Application No. 202011017186.3 are hereby incorporated by reference in their entireties.

TECHNICAL FIELD

Embodiments of the present disclosure relate to the technical field of integrated circuits, and in particular to a dual reference voltage generator, an equalizer circuit, and a memory.

BACKGROUND

In computer high-speed links, as transmission speeds of data signals become increasingly high, it is difficult to avoid generating significant Inter Symbol Interference (ISI). There is therefore a need to equalize data signals over the high-speed links to recover usable data signals.

In the design of a memory receiver circuit, a Continuous Time Linear Equalizer (CTLE) architecture is mainly used for performing equalization processing, and has a function of compensating signals according to the attenuation characteristics of a channel so as to improve the quality of the data signals.

In the current equalizer circuit, only one stable reference voltage is usually provided, and it is difficult to meet the processing requirements of a high-speed receiver on a received data signal. Therefore, how to design a reference voltage in an equalizer circuit to improve an equalization processing effect of the equalizer circuit is currently an issue that needs to be solved urgently.

SUMMARY

Embodiments of the present disclosure provide a dual reference voltage generator, an equalizer circuit, and a memory, which can effectively improve an equalization processing effect of the equalizer circuit.

In a first aspect, an embodiment of the present disclosure provides a dual reference voltage generator, which may be applied to an equalizer circuit. The dual reference voltage generator is configured to receive an original code, a first code and a second code, generate a first reference voltage according to the received original code and first code, and generate a second reference voltage according to the received original code and second code, the first reference voltage is different from the second reference voltage.

The dual reference voltage generator provided by the present disclosure may provide two different reference voltages, can better meet the requirements on the different reference voltages during an equalization processing process, and can improve an equalization processing effect of the equalizer circuit.

In a second aspect, an embodiment of the present disclosure provides an equalizer circuit, which may include: a dual reference voltage generator, a first input buffer circuit, a second input buffer circuit and a selecting and sampling circuit.

The dual reference voltage generator may be the dual reference voltage generator provided in the first aspect of the present disclosure. Two different reference voltages output by the dual reference voltage generator may be input reference voltages of the first input buffer circuit and the second input buffer circuit, respectively.

The first input buffer circuit and the second input buffer circuit may be respectively connected to the selecting and sampling circuit.

The selecting and sampling circuit may be configured to select, according to data previously output by the equalizer circuit, whether to perform data sampling on a data signal output by the first input buffer circuit or a data signal output by the second input buffer circuit, and take sampled data as data currently output by the equalizer circuit.

In a third aspect, embodiments of the present disclosure provide a memory, which may include an equalizer circuit. The equalizer circuit may be the equalizer circuit provided in the second aspect of the present disclosure.

BRIEF DESCRIPTION OF THE DRAWINGS

In order to more clearly illustrate the technical solutions in the embodiments of the present disclosure or the prior art, the drawings used in the description of the embodiments of the present disclosure or the prior art will be briefly described below. It is apparent that the drawings in the following description are some embodiments of the present disclosure, and other drawings may be obtained from those skilled in the art according to these drawings without any creative work.

DETAILED DESCRIPTION

In order to make the objectives, technical solutions, and advantages of the embodiments of the present disclosure clearer, the technical solutions in the embodiments of the present disclosure will be clearly and completely described below with reference to the drawings in the embodiments of the present disclosure. It is apparent that the described embodiments are a part of the embodiments of the present disclosure, not all of the embodiments. All other embodiments obtained by those of ordinary skill in the art based on the embodiments of the present disclosure without creative efforts should fall within the scope of protection of the present disclosure.

An embodiment of the present disclosure provides a novel dual reference voltage generator which is applied to an equalizer circuit. The equalizer circuit may be applied to various types of high-speed interface circuits, may be particularly applied to receiver circuits in various memory products, and may be, for example, applied to receiver circuits in DDR4 type memories.

Currently, in the design of the equalizer circuit, only one stable reference voltage is usually adopted, and it is difficult to meet the requirements of a current equalizer circuit on an equalization processing effect.

In order to improve the equalization processing effect of the equalizer circuit, the embodiment of the present disclosure provides a dual reference voltage generator applied to the equalizer circuit. The dual reference voltage generator may provide two different reference voltages and input the two different reference voltages into two input buffer circuits of the equalizer circuit. When acquiring data, the equalizer circuit may be configured to select, according to data previously output by the equalizer circuit, one of the two input buffer circuits and perform the data acquisition on a data signal output by the selected input buffer circuit, so as to perform equalization processing in advance, so that the requirements on different reference voltages in the equalization processing process can be better met, and the equalization processing effect can be improved.

Specifically, the dual reference voltage generator may be configured to receive an original code, a first code and a second code, generate a first reference voltage according to the received original code and first code, and generate a second reference voltage according to the received original code and second code. The first reference voltage is different from the second reference voltage.

The embodiments of the present disclosure provide a dual reference voltage generator, an equalizer circuit, and a memory. The dual reference voltage generator is applied to the equalizer circuit. The dual reference voltage generator is configured to receive an original code, a first code and a second code, and output two different reference voltages according to the received original code, first code, and second code. That is, the dual reference voltage generator provided by the present disclosure can better meet the requirements on the different reference voltages during an equalization processing process, and can improve the equalization processing effect of the equalizer circuit. In addition, the values of the original code, the first code and the second code are pre-configured, so that a voltage margin and a timing margin in an eye diagram corresponding to the received data of the equalizer circuit are made to be at maximum values, and the quality of a received data signal can be improved.

Figure 1:
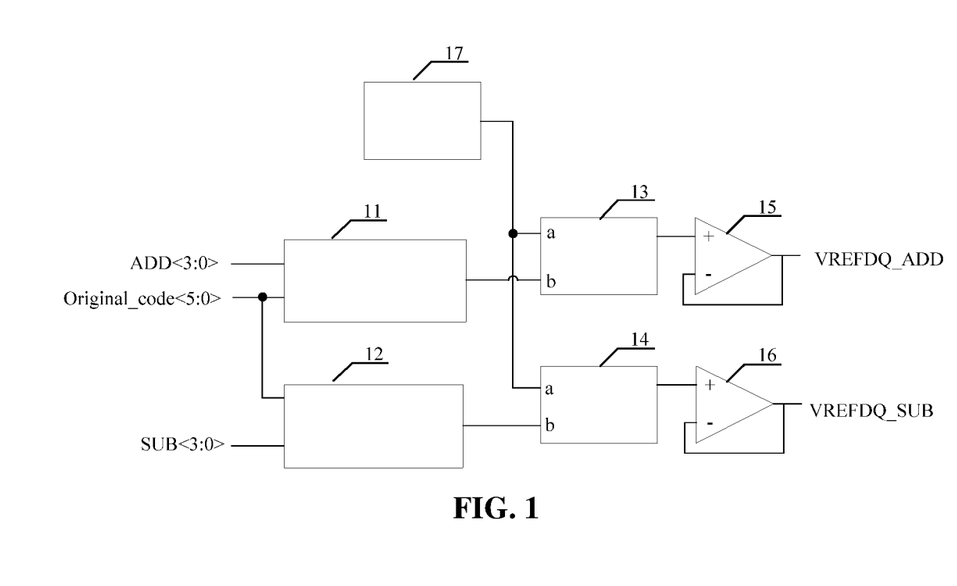
FIG. 1 is a structure diagram of a dual reference voltage generator according to an embodiment of the present disclosure.

Referring to FIG. 1, which is a structure diagram of a dual reference voltage generator according to an embodiment of the present disclosure, the dual reference voltage generator includes:

a first processing circuit 11, a second processing circuit 12, a first selector 13, a second selector 14, a first output buffer circuit 15, a second output buffer circuit 16 and a voltage divider circuit 17.

Two input terminals of the first processing circuit 11 are configured to respectively receive a first code ADD<3:0> and an original code Original_code<5:0>. An output terminal of the first processing circuit 11 is connected to a control terminal b of the first selector 13.

Two input terminals of the second processing circuit 12 are configured to respectively receive a second code SUB<3:0> and the original code Original_code<5:0>. An output terminal of the second processing circuit 12 is connected to a control terminal b of the second selector 14.

One or more output terminals of the voltage divider circuit 17 are respectively connected to an input terminal of the first selector 13 and an input terminal of the second selector 14.

The voltage divider circuit 17 includes multiple voltage output terminals having output voltages different from one another.

Alternatively, the voltage divider circuit 17 includes a resistive voltage divider circuit, which may obtain a series of division voltages by series connection of a series of resistors.

The multiple voltage output terminals of the voltage divider circuit 17 are respectively connected to multiple input terminals of the first selector 13 and multiple input terminals of the second selector 14. It is to be noted that, for ease of understanding, FIG. 1 shows that only one of the voltage output terminals of the voltage divider circuit 17 is connected to one of input terminals a of the first selector 13, and shows that only one of the voltage output terminals of the voltage divider circuit 17 is connected to one of input terminals a of the second selector 14.

An output terminal of the first selector 13 is connected to an input terminal of the first output buffer circuit 15. An output terminal of the second selector 14 is connected to an input terminal of the second output buffer circuit 16. A first reference voltage VREFDQ_ADD is output from an output terminal of the first output buffer circuit 15. A second reference voltage VREFDQ_SUB is output from an output terminal of the second output buffer circuit 16.

In a possible implementation of the present disclosure, the first selector 13 is configured to select, based on a code output by the first processing circuit 11, one of multiple voltages output from the voltage divider circuit 17, and output a selected voltage to the first output buffer circuit 15. The second selector 14 is configured to select, based on a code output by the second processing circuit 12, one of multiple voltages output from the voltage divider circuit 17, and output a selected voltage to the second output buffer circuit 16.

Specifically, the first processing circuit 11 is configured to receive the first code ADD<3:0> and the original code Original_code<5:0>, process the first code ADD<3:0> and the original code Original_code<5:0>, and input a processed code into the first selector 13. The first selector 13 is configured to select, according to the received code, one of multiple voltages output by the voltage divider circuit 17, and then output the selected voltage to the first output buffer circuit 15. The first output buffer circuit 15 is configured to output the first reference voltage VREFDQ_ADD based on the received voltage.

Similarly, the second processing circuit 12 is configured to receive the second code SUB<3:0> and the original code Original_code<5:0>, process the second code SUB<3:0> and the original code Original_code<5:0>, and input a processed code into the second selector 14. The second selector 14 is configured to select, according to the received code, one of multiple voltages output by the voltage divider circuit 17, and then output a selected voltage to the second output buffer circuit 16. The second output buffer circuit 16 is configured to output the second reference voltage VREFDQ_SUB based on the received voltage.

Alternatively, the original code Original_code<5:0> may be bits 0, 1, 2, 3, 4, and 5 of a mode register MR6 in a DDR4 memory, i.e., MR6 A[5:0]. MR6 A[5:0] may be configured in a VREFDQ calibration mode of the DDR4 memory in the present disclosure.

In a possible implementation, the first selector 13 and the second selector 14 have the same circuit structure; and/or, the first output buffer circuit 15 and the second output buffer circuit 16 have the same circuit structure. The circuit matching degree can be improved, and the cost of the circuit design can be saved.

The dual reference voltage generator provided by the embodiment of the present disclosure may output two different reference voltages based on the first code, the second code, and the original code, the requirements of the different reference voltages during the equalization processing process can be better met, and an equalization processing effect of the equalizer circuit can be improved.

Figure 2:
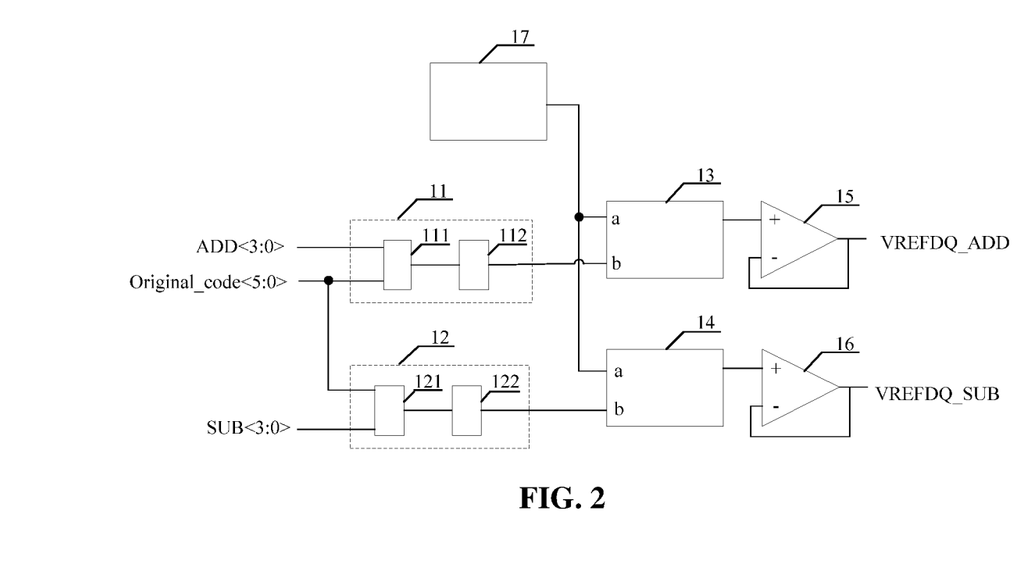
FIG. 2 is a structure diagram of another dual reference voltage generator according to an embodiment of the present disclosure.

Based on what has been described in the above embodiments, referring to FIG. 2, FIG. 2 is a structure diagram of another dual reference voltage generator according to an embodiment of the present disclosure.

In the embodiments of the present disclosure, the first processing circuit 11 includes an adder 111. The adder 111 is configured to perform addition operation processing on the first code ADD<3:0> and the original code Original_code<5:0> that are received by the first processing circuit 11 and output a processed code.

Exemplarily, the adder 111 may add ADD<3:0> to Original_code<5:0>.

The second processing circuit 12 includes a subtractor 121. The subtractor 121 is configured to perform subtraction operation processing on the second code SUB<3:0> and the original code Original_code<5:0> that are received by the second processing circuit 12 and output a processed code.

Exemplarily, the subtractor 121 may subtract SUB<3:0> from Original_code<5:0>.

The first processing circuit 11 further includes a first decoder 112. An input terminal of the first decoder 112 is connected to an output terminal of the adder 111. An output terminal of the first decoder 112 is connected to the control terminal b of the first selector 13.

The second processing circuit 12 further includes a second decoder 122. An input terminal of the second decoder 122 is connected to an output terminal of the subtractor 121. An output terminal of the second decoder 122 is connected to the control terminal b of the second selector 14.

The first decoder 112 is configured to decode the code output by the adder 111 and output data of a specific format. Similarly, the second decoder 122 is configured to decode the code output by the subtractor 121.

Alternatively, the first decoder and the second decoder may have the same circuit structure, so that the circuit matching degree can be improved, and the cost of the circuit design can be saved.

In the embodiments of the present disclosure, as the code values received by the first selector 13 and the second selector 14 are larger, a larger voltage is selected from the series of voltages generated by the voltage divider circuit 17 for output.

It will be appreciated that the code output by the first decoder 112 is generated based on the addition of the first code ADD<3:0> and the original code Original_code<5:0>, while the code output by the second decoder 122 is generated based on the subtraction of the second code SUB<3:0> and the original code Original_code<5:0>. Therefore, the code value received by the first selector 13 is larger than the code value received by the second selector 14, and the selected voltage of the first selector 13 among the series of voltages output by the voltage divider circuit 17 is larger than the selected voltage of the second selector 14 among the series of voltages output by the voltage divider circuit 17, so that the finally output first reference voltage may be greater than the second reference voltage.

Figure 3:
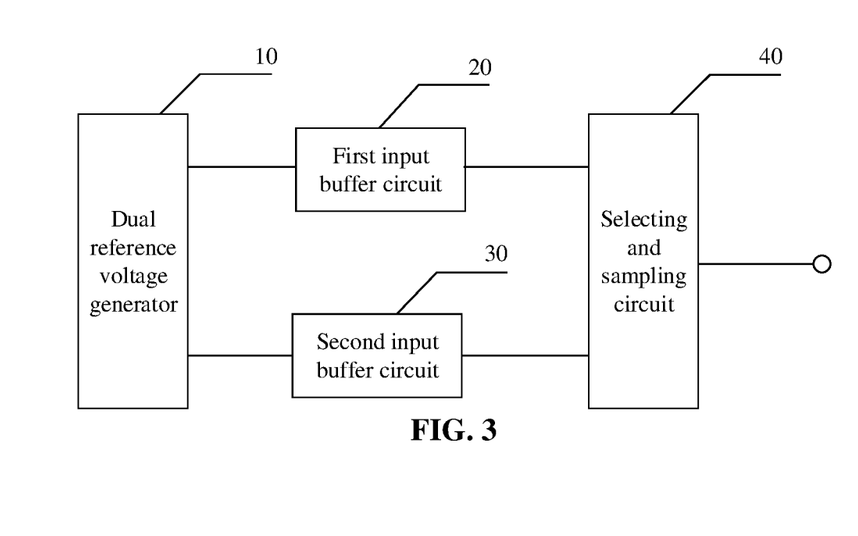
FIG. 3 is a structure diagram of an equalizer circuit according to an embodiment of the present disclosure.

Furthermore, based on what has been described in the above embodiments, an equalizer circuit is also provided in an embodiment of the present disclosure. Referring to FIG. 3, FIG. 3 is a circuit diagram of an equalizer circuit according to an embodiment of the present disclosure. In FIG. 3, the equalizer circuit includes: a dual reference voltage generator 10, a first input buffer circuit 20, a second input buffer circuit 30 and a selecting and sampling circuit 40.

The dual reference voltage generator 10 is the dual reference voltage generator described in the above embodiments, which may specifically refer to the content in the above embodiments. Descriptions thereof are omitted herein.

In the present embodiments, two different reference voltages output by the dual reference voltage generator 10 serve as input reference voltages of the first input buffer circuit 20 and the second input buffer circuit 30, respectively.

The first input buffer circuit 20 and the second input buffer circuit 30 are connected to the selecting and sampling circuit 40, respectively. The selecting and sampling circuit 40 is configured to select, according to data previously output by the equalizer circuit, whether to perform data sampling on a data signal output by the first input buffer circuit 20 or a data signal output by the second input buffer circuit 30, and take sampled data as data currently output by the equalizer circuit.

Exemplarily, when the value of the data previously output by the equalizer circuit is 1, the selecting and sampling circuit 40 is configured to select to perform data sampling on a data signal output by the first input buffer circuit 20 and take sampled data as data currently output by the equalizer circuit. When the value of the data previously output by the equalizer circuit is 0, the selecting and sampling circuit 40 is configured to select to perform data sampling on a data signal output by the second input buffer circuit 30 and take sampled data as data currently output by the equalizer circuit.

It will be appreciated that since the reference voltages adopted by the first input buffer circuit 20 and the second input buffer circuit 30 are different, the voltage margins at which the first input buffer circuit 20 and the second input buffer circuit 30 compare the received data with the reference voltages will also be different. When acquiring data, the selecting and sampling circuit 40 selects, according to the data previously output by the equalizer circuit, whether to perform data acquisition on the data signal output by the first input buffer circuit 20 or the data signal output by the second input buffer circuit 30, so that the equalizer circuit can perform data equalization processing in advance according to the data previously output, ISI is eliminated, and the quality of a received data signal is improved.

Figure 4:
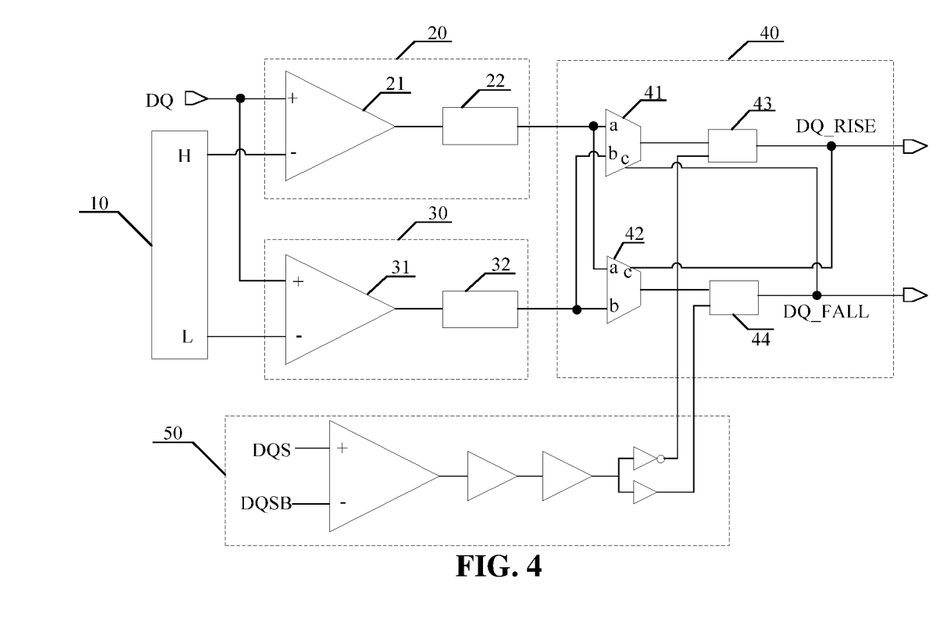
FIG. 4 is a structure diagram of another equalizer circuit according to an embodiment of the present disclosure.

Further, based on what has been described in the above embodiments, referring to FIG. 4, FIG. 4 is a structure diagram of another equalizer circuit according to an embodiment of the present disclosure. In a possible implementation of the present disclosure, the dual reference voltage generator 10 includes a first reference voltage output terminal H and a second reference voltage output terminal L. A first reference voltage output by the first reference voltage output terminal H is different from a second reference voltage output by the second reference voltage output terminal L.

Alternatively, the first reference voltage is greater than the second reference voltage.

The first reference voltage output terminal H is connected to a reference voltage input terminal of the first input buffer circuit 20. The second reference voltage output terminal L is connected to a reference voltage input terminal of the second input buffer circuit 30.

In the embodiments of the present disclosure, the selecting and sampling circuit 40 includes a selection circuit and a sampling circuit. The selection circuit is connected to the sampling circuit. The selection circuit may be configured to select, according to data sent by the sampling circuit, whether to input a data signal output by the first input buffer circuit 20 or a data signal output by the second input buffer circuit 30 to the sampling circuit. The sampling circuit is configured to perform data sampling on the data signal input by the selection circuit.

Specifically, still referring to FIG. 4, the selection circuit includes a first selection circuit 41 and a second selection circuit 42, and the sampling circuit includes a first sampling circuit 43 and a second sampling circuit 44.

Two input terminals a and b of the first selection circuit 41 are connected to the output terminal of the first input buffer circuit 20 and the output terminal of the second input buffer circuit 30, respectively. Two input terminals a and b of the second selection circuit 42 are connected to the output terminal of the first input buffer circuit 20 and the output terminal of the second input buffer circuit 30 respectively.

An output terminal of the first selection circuit 41 is connected to an input terminal of the first sampling circuit 43. A control terminal c of the first selection circuit 41 is connected to an output terminal of the second sampling circuit 44. An output terminal of the second selection circuit 42 is connected to an input terminal of the second sampling circuit 44. A control terminal c of the second selection circuit 42 is connected to an output terminal of the first sampling circuit 43.

The first sampling circuit 43 is configured to send currently acquired data DQ_RISE to the control terminal c of the second selection circuit 42. The second selection circuit 42 is configured to select, based on the data DQ_RISE sent by the first sampling circuit 43, whether to input the data in the first input buffer circuit 20 or the second input buffer circuit 30 to the second sampling circuit 44.

The second sampling circuit 44 is configured to send currently acquired data DQ_FALL to the control terminal c of the first selection circuit 41. The first selection circuit 41 is configured to select, based on the data DQ_FALL sent by the second sampling circuit 44, whether to input the data in the first input buffer circuit 20 or the second input buffer circuit 30 to the first sampling circuit 43.

Alternatively, when the data DQ_RISE sent by the first sampling circuit 43 to the control terminal c of the second selection circuit 42 is 1, the second selection circuit 42 is configured to select to input the output data of the first input buffer circuit 20 to the second sampling circuit 44. When the data DQ_RISE sent by the first sampling circuit 43 to the control terminal c of the second selection circuit 42 is 0, the second selection circuit 42 is configured to select to input the output data of the second input buffer circuit 30 to the second sampling circuit 44.

When the data DQ_FALL sent by the second sampling circuit 44 to the control terminal c of the first selection circuit 41 is 1, the first selection circuit 41 is configured to select to input the output data of the first input buffer circuit 20 to the first sampling circuit 43. When the data DQ_FALL sent by the second sampling circuit 44 to the control terminal c of the first selection circuit 41 is 0, the first selection circuit 41 is configured to select to input the output data of the second input buffer circuit 30 to the first sampling circuit 43.

Alternatively, the first selection circuit 41 and the second selection circuit 42 may have the same circuit structure, so that the circuit matching degree can be improved, and the cost of the circuit design can be saved.

Alternatively, the first sampling circuit 43 and the second sampling circuit 44 may also have the same circuit structure, so that the circuit matching degree can be improved, and the circuit design cost can be saved.

Furthermore, the equalizer circuit further includes a sampling clock input circuit 50. An output terminal of the sampling clock input circuit 50 is connected to sampling clock input terminals of the first sampling circuit 43 and the second sampling circuit 44, respectively, and sampling clock signals may be provided to the first sampling circuit 43 and the second sampling circuit 44.

The sampling clock input circuit 50 may be configured to receive sampling clock signals DQS and DQSB that are inverted to each other.

In addition, sampling clock input circuit 50 includes a comparator circuit and a delay circuit. The delay circuit may be configured to adjust the phase of a sampling clock signal output by the comparator circuit.

Exemplarily, when the received sampling clock signal DQS is in a rising edge, the first sampling circuit 43 performs data sampling based on the data signal output by the first selection circuit 41 to acquire data DQ_RISE, and sends the data DQ_RISE to the second selection circuit 42 as a control signal of the second selection circuit 42. When the received sampling clock signal DQS is in a falling edge, the second sampling circuit 44 performs data sampling based on the data signal output by the second selection circuit 42 to acquire data DQ_FALL, and sends the data DQ_FALL to the first selection circuit 41 as a control signal of the first selection circuit 41.

Furthermore, still referring to FIG. 4, the first input buffer circuit 20 includes a first comparator circuit 21 and a first delay circuit 22. The first comparator circuit 21 is connected in series with the first delay circuit 22. A reference voltage input terminal of the first comparator circuit 21 is connected to the first reference voltage output terminal H.

The second input buffer circuit 30 includes a second comparator circuit 31 and a second delay circuit 32. The second comparator circuit 31 is connected in series with the second delay circuit 32. A reference voltage input terminal of the second comparator circuit 31 is connected to the second reference voltage output terminal L.

A signal input terminal of the first comparator circuit 21 and a signal input terminal of the second comparator circuit 31 are connected to the same input data signal DQ.

The first delay circuit 22 may be configured to adjust the phase of the DQ signal, so that the DQ signal received by the first sampling circuit 43 can remain synchronized with the sampling clock signal, and therefore the first sampling circuit 43 can acquire correct data according to the sampling clock signal. The second delay circuit 32 is also configured to adjust the phase of the DQ signal, so that the DQ signal received by the second sampling circuit 44 remains synchronized with the sampling clock signal, and therefore the second sampling circuit 44 can acquire correct data according to the sampling clock signal.

Alternatively, the first comparator circuit 21 and the second comparator circuit 31 may have the same circuit structure, so that the circuit matching degree can be improved, and the cost of the circuit design can be saved.

Alternatively, the first delay circuit 22 and the second delay circuit 32 may also have the same circuit structure, so that the circuit matching degree can be improved, and the cost of the circuit design can be saved.

It will be appreciated that if the data currently output by the equalizer circuit is the data acquired by the first sampling circuit 43 when the sampling clock signal DQS is in the rising edge, the data previously output by the equalizer circuit is the data acquired by the second sampling circuit 44 when the sampling clock signal DQS is in a previous adjacent falling edge of the rising edge. If the data currently output by the equalizer circuit is the data acquired by the second sampling circuit 44 when the sampling clock signal DQS is in the falling edge, the data previously output by the equalizer circuit is the data acquired by the first sampling circuit 43 when the sampling clock signal DQS is in a previous adjacent rising edge of the falling edge.

Figure 5:
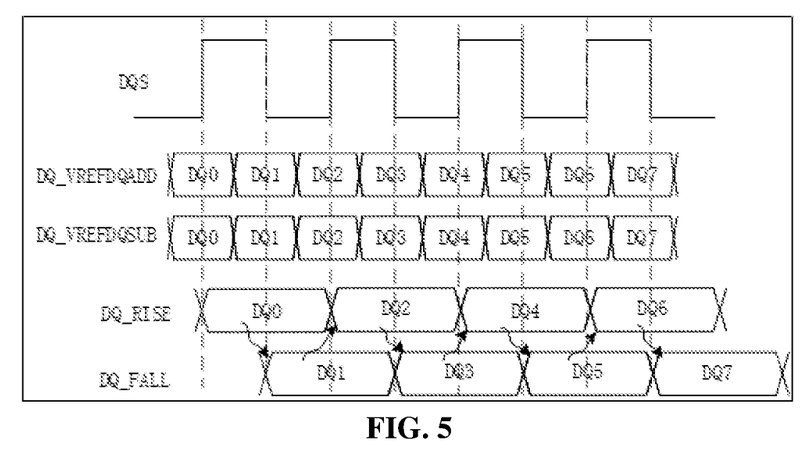
FIG. 5 is a waveform diagram of an equalizer circuit during data acquisition according to an embodiment of the present disclosure.

For a better understanding of the embodiments of the present disclosure, referring to FIG. 5, FIG. 5 is a waveform diagram of an equalizer circuit during data acquisition according to an embodiment of the present disclosure.

In FIG. 5, DQ_VREFDQADD represents data output by the first input buffer circuit 20 based on the DQ signal and the first reference voltage H, the DQ_VREFDQADD includes DQ0, DQ1, DQ2, . . . DQ_VREFDQSUB represents data output by the second input buffer circuit 30 based on the DQ signal and the second reference voltage L, and DQ_VREFDQSUB also includes DQ0, DQ1, DQ2, . . . .

In the embodiments of the present disclosure, when the sampling clock signal DQS received by the first sampling circuit 43 is in a rising edge, data DQ0 is acquired, and DQ0 is sent to the second selection circuit 42. If the value of the data DQ0 is 1, the second selection circuit 42 outputs, through the input terminal a thereof, the data generated in the first input buffer circuit 20 to the second sampling circuit 44. When the sampling clock signal DQS received by the second sampling circuit 44 is in a falling edge, data DQ1 output by the first input buffer circuit 20 may be acquired. If the value of the data DQ0 is 0, the second selection circuit 42 outputs, through the input terminal b thereof, the data generated in the second input buffer circuit 30 to the second sampling circuit 44. When the sampling clock signal DQS received by the second sampling circuit 44 is in a falling edge, the data DQ1 output by the second input buffer circuit 30 may be acquired.

Similarly, after the data DQ1 is acquired by the second sampling circuit 44, DQ1 is sent to the first selection circuit 41. If the value of the data DQ1 is 1, the first selection circuit 41 outputs, through the input terminal a thereof, the data generated in the first input buffer circuit 20 to the first sampling circuit 43. When the sampling clock signal DQS received by the first sampling circuit 43 is in a rising edge, data DQ2 output by the first input buffer circuit 20 may be acquired. If the value of the data DQ1 is 0, the first selection circuit 41 outputs, through the input terminal b thereof, the data generated in the second input buffer circuit 30 to the first sampling circuit 43. When the sampling clock signal DQS received by the first sampling circuit 43 is in a rising edge, the data DQ2 output by the second input buffer circuit 30 may be acquired.

Based on what has been described in the above embodiments, in a possible implementation of the present disclosure, the first reference voltage is an enhancement of a reference voltage and the second reference voltage is a reduction of the reference voltage. Therefore, when the data previously output by the equalizer circuit is 1, the data signal output by the first input buffer circuit using the first reference voltage as the reference voltage is selected so as to be subjected to data sampling. When the data previously output by the equalizer circuit is 0, the data signal output by the second input buffer circuit using the second reference voltage as the reference voltage is selected so as to be subjected to data sampling. In this way, the input voltage margin of the equalizer circuit can be effectively improved, so that ISI is effectively eliminated, and the opening size of an eye diagram of written data is increased.

Figure 6:
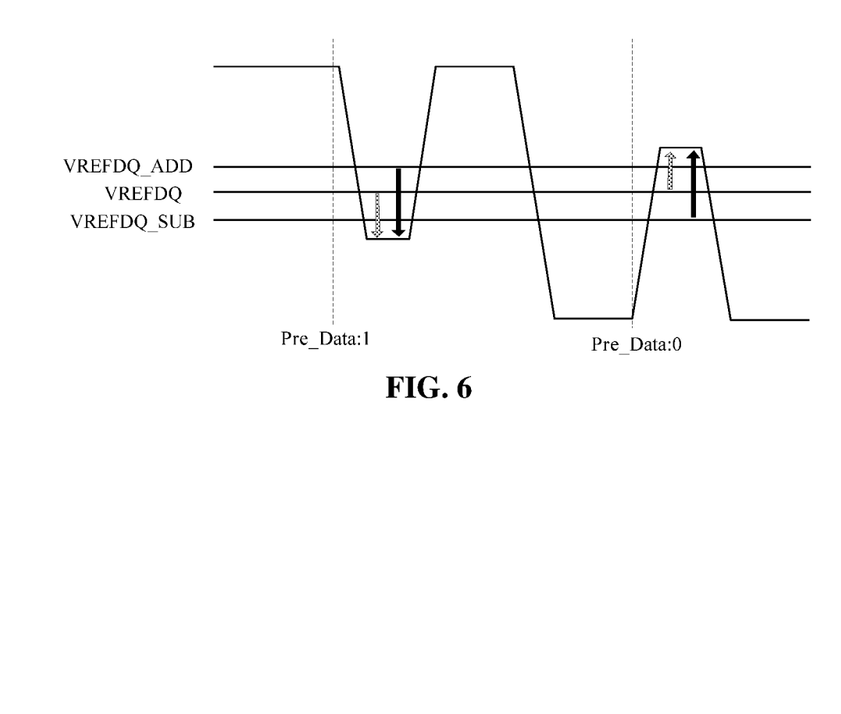
FIG. 6 is a schematic diagram of an equalization processing effect of an equalizer circuit according to an embodiment of the present disclosure.

For a better understanding of the embodiments of the present disclosure, referring to FIG. 6, FIG. 6 is a schematic diagram of an equalization processing effect of an equalizer circuit according to an embodiment of the present disclosure.

In FIG. 6, it can be clearly seen that when the value of data Pre_Data previously output by the equalizer circuit is 1, the data signal output by the first input buffer circuit using the first reference voltage VREFDQ_ADD as the reference voltage is selected so as to be subjected to data sampling, in this case, the input voltage margin (indicated by a black arrow) of the equalizer circuit is significantly greater than the input voltage margin (indicated by a gray arrow) of the equalizer circuit when the data signal output by the input buffer circuit using the reference voltage VREFDQ as the reference voltage is subjected to data sampling.

Similarly, when the value of data Pre_Data previously output by the equalizer circuit is 0, the data signal output by the second input buffer circuit using the first reference voltage VREFDQ_SUB as the reference voltage selected so as to be subjected to data sampling, in this case, the input voltage margin (indicated by a black arrow) of the equalizer circuit is significantly greater than the input voltage margin (indicated by a gray arrow) of the equalizer circuit when the data signal output by the input buffer circuit using the reference voltage VREFDQ as the reference voltage for data sampling.

The equalizer circuit provided by the embodiments of the present disclosure includes two input buffer circuits adopting different reference voltages. During data acquisition, an appropriate input buffer circuit is selected from the two input buffer circuits based on data previously output by the equalizer circuit, and then a data signal output by the selected input buffer circuit is subjected to data sampling, so that an input voltage margin of the equalizer circuit can be effectively increased, and the quality of a received data signal is improved.

Based on what has been described in the above embodiments, in a possible implementation of the present disclosure, a voltage margin and a timing margin in an eye diagram corresponding to the received data of the equalizer circuit may be made to be at maximum values by configuring the values of the original code Original_code<5:0>, the first code ADD<3:0>, and the second code SUB<3:0> as target values.

Figure 7:
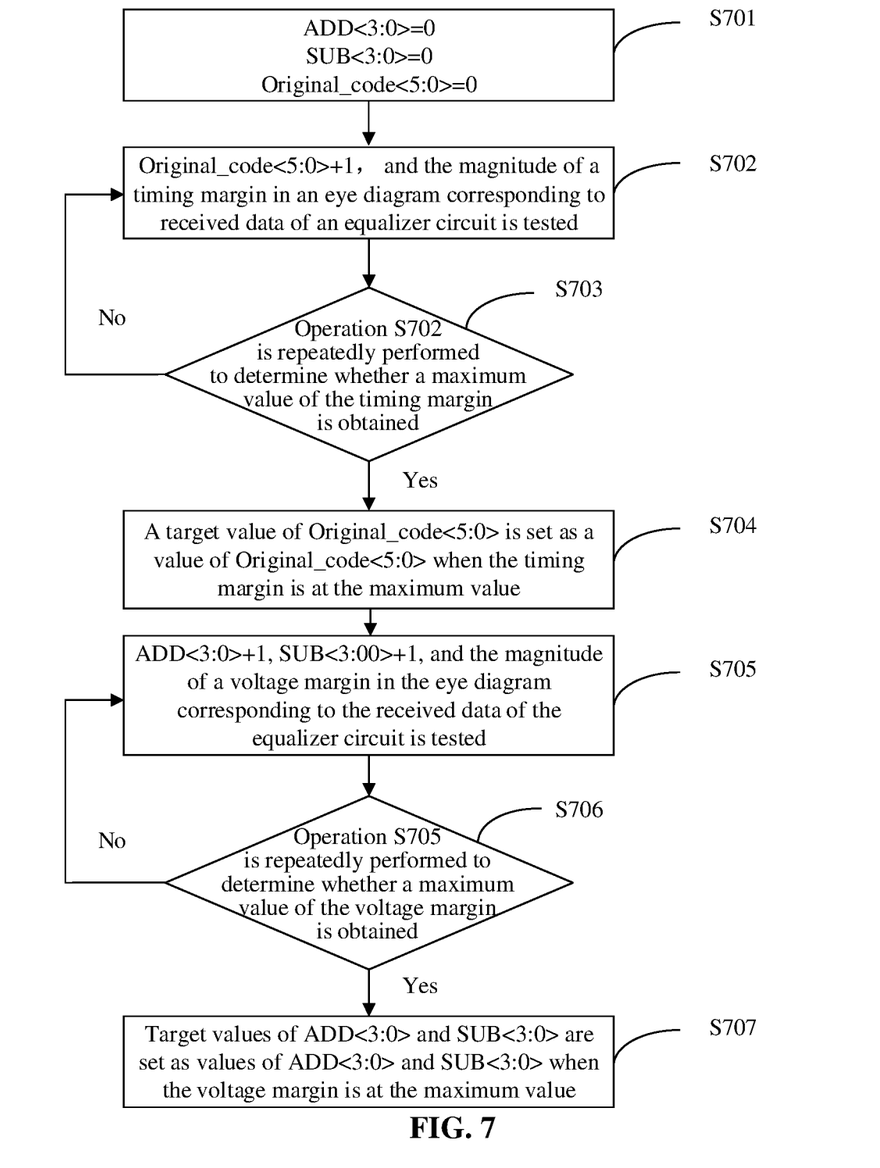
FIG. 7 is a flowchart for determining an input code of a dual reference voltage generator according to an embodiment of the present disclosure.

Specifically, referring to FIG. 7, FIG. 7 is a flowchart for determining an input code of a reference voltage generator according to an embodiment of the present disclosure. The target values of the original code Original_code<5:0>, the first code ADD<3:0>, and the second code SUB<3:0> may be determined by operations S701-S707.

In operation S701, initial values of the first code ADD<3:0>, the second code SUB<3:0>, and the original code Original_code<5:0> are set as 0.

In operation S702: the value of the original code Original_code<5:0> is added with 1, and the magnitude of a timing margin in an eye diagram corresponding to received data of an equalizer circuit is tested.

In operation S703, operation S702 is repeatedly performed until a maximum value of the timing margin is obtained.

In operation S704, the target value of Original_code<5:0> is set as the value of Original_code<5:0> when the timing margin is made to be at the maximum value.

In operation S705: the values of ADD<3:0> and SUB<3:0> are added with 1 respectively, and the magnitude of a voltage margin in the eye diagram corresponding to the received data of the equalizer circuit is tested.

In operation S706, operation S705 is repeatedly performed until a maximum value of the voltage margin is obtained.

In operation S707, the target values of ADD<3:0> and SUB<3:0> are set as the values of ADD<3:0> and SUB<3:0> when the voltage margin is made to be at the maximum value.

That is, in the embodiments of the present disclosure, when the values of the first code ADD<3:0>, the second code SUB<3:0>, and the original code Original_code<5:0> that are received by the dual reference voltage generator 10 are the target values above, the voltage margin and the timing margin in the eye diagram corresponding to the received data of the equalizer circuit are made to be at the maximum values, and the quality of the received data signal can be improved.

Alternatively, the flow shown in FIG. 7 may be performed by a controller in a storage system or by a test engineer. The flow may be performed once in the same system environment, the input codes are fixed after the execution, and the input codes may be directly updated into a circuit register when a subsequent storage system is powered on.

Furthermore, based on the equalizer circuit described in the above embodiments, a memory is also provided in embodiments of the present disclosure. The memory includes the equalizer circuit described in the above embodiments. Reference may be made in particular to the working principle of the equalizer circuit described in the above embodiments. Descriptions thereof are omitted herein.

Finally, it is to be noted that the above embodiments are only used to illustrate the technical solutions of the present disclosure, and are not limited thereto. Although the present disclosure has been described in detail with reference to the foregoing embodiments, those skilled in the art should understand that the technical solutions described in the foregoing embodiments are modified, or some or all technical features are equivalently replaced, but the modifications and replacements do not make the essence of the corresponding technical solutions depart from the scope of the technical solutions of various embodiments of the present disclosure.

The invention claimed is:

1. A dual reference voltage generator, applied to an equalizer circuit,
wherein the dual reference voltage generator is configured to receive an original code, a first code and a second code, generate a first reference voltage according to the original code and the first code, and generate a second reference voltage according to the original code and the second code, the first reference voltage being different from the second reference voltage;
the dual reference voltage generator comprises: a first processing circuit, a second processing circuit, a first selector, a second selector, a first output buffer circuit, a second output buffer circuit and a voltage divider circuit;
two input terminals of the first processing circuit are configured to respectively receive the first code and the original code, and an output terminal of the first processing circuit is connected to a control terminal of the first selector;
two input terminals of the second processing circuit are configured to respectively receive the second code and the original code, and an output terminal of the second processing circuit is connected to a control terminal of the second selector;
one or more output terminals of the voltage divider circuit are respectively connected to one or more input terminals of the first selector and one or more input terminals of the second selector; and
an output terminal of the first selector is connected to an input terminal of the first output buffer circuit, an output terminal of the second selector is connected to an input terminal of the second output buffer circuit, the first reference voltage is output from an output terminal of the first output buffer circuit, and the second reference voltage is output from an output terminal of the second output buffer circuit.

2. The dual reference voltage generator of claim 1, wherein the voltage divider circuit comprises a plurality of voltage output terminals having output voltages different from one another.

3. The dual reference voltage generator of claim 2, wherein the plurality of voltage output terminals of the voltage divider circuit are respectively connected to a plurality of input terminals of the first selector and a plurality of input terminals of the second selector.

4. The dual reference voltage generator of claim 3, wherein the first selector is configured to select, based on a code output by the first processing circuit, one of a plurality of voltages output from the voltage divider circuit, and output the one of the plurality of voltages to the first output buffer circuit; and the second selector is configured to select, based on a code output by the second processing circuit, a second one of the plurality of voltages output from the voltage divider circuit, and output the second one of the plurality of voltages to the second output buffer circuit.

5. The dual reference voltage generator of claim 4, wherein the first processing circuit comprises an adder for performing addition operation processing on the original code and the first code that are received by the first processing circuit, and outputting a processed code; and
the second processing circuit comprises a subtractor for performing subtraction operation processing on the original code and the second code that are received by the second processing circuit, and outputting a second processed code.

6. The dual reference voltage generator of claim 5, wherein the first processing circuit further comprises a first decoder, an input terminal of the first decoder being connected to an output terminal of the adder, and an output terminal of the first decoder being connected to the control terminal of the first selector; and
the second processing circuit further comprises a second decoder, an input terminal of the second decoder being connected to an output terminal of the subtractor, and an output terminal of the second decoder being connected to the control terminal of the second selector.

7. The dual reference voltage generator of claim 1, wherein the first reference voltage is greater than the second reference voltage.

8. The dual reference voltage generator of claim 1, wherein the first selector and the second selector have a same circuit structure.

9. The dual reference voltage generator of claim 1, wherein the first output buffer circuit and the second output buffer circuit have a same circuit structure.

10. The dual reference voltage generator of claim 6, wherein the first decoder and the second decoder have a same circuit structure.

11. An equalizer circuit, comprising: a dual reference voltage generator, a first input buffer circuit, a second input buffer circuit and a selecting and sampling circuit,
wherein the dual reference voltage generator is configured to receive an original code, a first code and a second code, generate a first reference voltage according to the original code and the first code, and generate a second reference voltage according to the original code and the second code, the first reference voltage being different from the second reference voltage;
the dual reference voltage generator comprises: a first processing circuit, a second processing circuit, a first selector, a second selector, a first output buffer circuit, a second output buffer circuit and a voltage divider circuit;
two input terminals of the first processing circuit are configured to respectively receive the first code and the original code, and an output terminal of the first processing circuit is connected to a control terminal of the first selector;
two input terminals of the second processing circuit are configured to respectively receive the second code and the original code, and an output terminal of the second processing circuit is connected to a control terminal of the second selector;
one or more output terminals of the voltage divider circuit are respectively connected to one or more input terminals of the first selector and one or more input terminals of the second selector;
an output terminal of the first selector is connected to an input terminal of the first output buffer circuit, an output terminal of the second selector is connected to an input terminal of the second output buffer circuit, the first reference voltage is output from an output terminal of the first output buffer circuit, and the second reference voltage is output from an output terminal of the second output buffer circuit;
the first reference voltage and the second reference voltage output by the dual reference voltage generator serve as input reference voltages of the first input buffer circuit and the second input buffer circuit, respectively;
the first input buffer circuit and the second input buffer circuit are respectively connected to the selecting and sampling circuit; and
the selecting and sampling circuit is configured to select, according to data previously output by the equalizer circuit, whether to perform data sampling on a data signal output by the first input buffer circuit or a data signal output by the second input buffer circuit, and take sampled data as data currently output by the equalizer circuit.

12. The equalizer circuit of claim 11, wherein when the original code, the first code and the second code that are received by the dual reference voltage generator are all at target values, a voltage margin and a timing margin in an eye diagram corresponding to received data of the equalizer circuit are made to be at maximum values.

13. The equalizer circuit of claim 12, wherein the target values of the original code, the first code and the second code are set by the following operations:
a first operation of setting initial values of the original code, the first code and the second code as 0;
a second operation of adding 1 to the value of the original code, and testing a magnitude of the timing margin in the eye diagram corresponding to the received data of the equalizer circuit;
a third operation of repeatedly performing the second operation until the maximum value of the timing margin is obtained;
a fourth operation of setting the target value of the original code as a value of the original code when the timing margin is at the maximum value;
a fifth operation of respectively adding 1 to the values of the first code and the second code, and testing a magnitude of the voltage margin in the eye diagram corresponding to the received data of the equalizer circuit;
a sixth operation of repeatedly performing the fifth operation until the maximum value of the voltage margin is obtained; and
a seventh operation of setting the target values of the first code and the second code as values of the first code and the second code when the voltage margin is at the maximum value.

14. A memory, comprising an equalizer circuit, wherein the equalizer circuit comprises: a dual reference voltage generator, a first input buffer circuit, a second input buffer circuit and a selecting and sampling circuit,
wherein the dual reference voltage generator is configured to receive an original code, a first code and a second code, generate a first reference voltage according to the original code and the first code, and generate a second reference voltage according to the original code and second code, the first reference voltage being different from the second reference voltage,
the dual reference voltage generator comprises: a first processing circuit, a second processing circuit, a first selector, a second selector, a first output buffer circuit, a second output buffer circuit and a voltage divider circuit;
two input terminals of the first processing circuit are configured to respectively receive the first code and the original code, and an output terminal of the first processing circuit is connected to a control terminal of the first selector;
two input terminals of the second processing circuit are configured to respectively receive the second code and the original code, and an output terminal of the second processing circuit is connected to a control terminal of the second selector;
one or more output terminals of the voltage divider circuit are respectively connected to one or more input terminals of the first selector and one or more input terminals of the second selector;
an output terminal of the first selector is connected to an input terminal of the first output buffer circuit, an output terminal of the second selector is connected to an input terminal of the second output buffer circuit, the first reference voltage is output from an output terminal of the first output buffer circuit, and the second reference voltage is output from an output terminal of the second output buffer circuit;
the first reference voltage and the second reference voltage output by the dual reference voltage generator serve as input reference voltages of the first input buffer circuit and the second input buffer circuit, respectively;

the first input buffer circuit and the second input buffer circuit are respectively connected to the selecting and sampling circuit; and the selecting and sampling circuit is configured to select, according to data previously output by the equalizer circuit, whether to perform data sampling on a data signal output by the first input buffer circuit or a data signal output by the second input buffer circuit, and take sampled data as data currently output by the equalizer circuit.

15. The memory of claim 14, wherein when the original code, the first code and the second code that are received by the dual reference voltage generator are all at target values, a voltage margin and a timing margin in an eye diagram corresponding to received data of the equalizer circuit are made to be at maximum values.

16. The memory of claim 15, wherein the target values of the original code, the first code and the second code are set by the following operations:

a first operation of setting initial values of the original code, the first code and the second code as 0;

a second operation of adding 1 to the value of the original code, and testing a magnitude of the timing margin in the eye diagram corresponding to the received data of the equalizer circuit;

a third operation of repeatedly performing the second operation until the maximum value of the timing margin is obtained;

a fourth operation of setting the target value of the original code as a value of the original code when the timing margin is at the maximum value;

a fifth operation of respectively adding 1 to the values of the first code and the second code, and testing a magnitude of the voltage margin in the eye diagram corresponding to the received data of the equalizer circuit;

a sixth operation of repeatedly performing the fifth operation until the maximum value of the voltage margin is obtained; and a seventh operation of setting the target values of the first code and the second code as values of the first code and the second code when the voltage margin is at the maximum value.

\* \* \* \* \*